(12) United States Patent
Li et al.

(10) Patent No.: US 9,614,017 B2
(45) Date of Patent: Apr. 4, 2017

(54) AMOLED BACKPLANE STRUCTURE AND MANUFACTURING METHOD THEREOF

(71) Applicant: Shenzhen China Star Optoelectronics Technology Co., Ltd., Shenzhen (CN)

(72) Inventors: Wenhui Li, Shenzhen (CN); Yifan Wang, Shenzhen (CN)

(73) Assignee: SHENZHEN CHINA STAR OPTOELECTRONICS TECHNOLODY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 14/761,310

(22) PCT Filed: Jun. 18, 2015

(86) PCT No.: PCT/CN2015/081720
§ 371 (c)(1),
(2) Date: Jul. 16, 2015

(87) PCT Pub. No.: WO2016/179875
PCT Pub. Date: Nov. 17, 2016

(65) Prior Publication Data
US 2016/0336385 A1    Nov. 17, 2016

(30) Foreign Application Priority Data

May 13, 2015 (CN) .......................... 2015 1 0243764

(51) Int. Cl.
*H01L 27/32* (2006.01)
*H01L 29/45* (2006.01)
(Continued)

(52) U.S. Cl.
CPC ...... *H01L 27/3258* (2013.01); *H01L 27/3211* (2013.01); *H01L 27/3246* (2013.01);
(Continued)

(58) Field of Classification Search
CPC ......... H01L 2227/323; H01L 2251/308; H01L 27/1255
See application file for complete search history.

(56) References Cited

U.S. PATENT DOCUMENTS

6,680,577 B1 *  1/2004  Inukai ..................... G09G 3/30
                                                    257/E29.275
7,221,092 B2 *  5/2007  Anzai ...................... G06F 1/32
                                                    313/503
(Continued)

*Primary Examiner* — Caridad Everhart
*Assistant Examiner* — Ankush Singal
(74) *Attorney, Agent, or Firm* — Leong C. Lei (57) ABSTRACT

The present invention provides an AMOLED backplane structure and a manufacturing method thereof. In each sub-pixel, a TFT substrate (TS) includes a corrugation structure (4) formed in an area corresponding to an opening (71) of a pixel definition layer (7). The corrugation structure (4) includes a plurality of raised sections (41) and a recessed section (42) formed between every two adjacent ones of the raised sections (41). An upper surface of a portion of the planarization layer (5) and a portion of a pixel electrode (6) that correspond to and are located above the corrugation structure (4) include curved surfaces corresponding to the corrugation structure (4). The AMOLED backplane structure helps ensure the planarization layer (5) is smooth and free of abrupt change sites and also makes the pixel electrode (6) in a form of a curved surface to increase an effective displaying surface, extend the lifespan of the OLED, reduce difficulty of manufacturing, and improve resolution.

13 Claims, 5 Drawing Sheets

(51) Int. Cl.
  *H01L 51/52* (2006.01)
  *H01L 51/56* (2006.01)
  *H01L 27/12* (2006.01)

(52) U.S. Cl.
  CPC ...... *H01L 27/3262* (2013.01); *H01L 27/3265* (2013.01); *H01L 29/45* (2013.01); *H01L 51/5206* (2013.01); *H01L 51/56* (2013.01); *H01L 27/1248* (2013.01); *H01L 27/1255* (2013.01); *H01L 2227/323* (2013.01); *H01L 2251/308* (2013.01)

(56) References Cited

U.S. PATENT DOCUMENTS

| | | | | |
|---|---|---|---|---|
| 7,301,279 | B2* | 11/2007 | Sakakura | H01L 27/1214 257/40 |
| 7,312,571 | B2* | 12/2007 | Kim | H01L 27/3244 313/504 |
| 8,519,385 | B2* | 8/2013 | Lim | H01L 51/5209 257/40 |
| 2002/0033918 | A1* | 3/2002 | Shigeno | G02F 1/133555 349/114 |
| 2003/0142253 | A1* | 7/2003 | Takenaka | G02F 1/133555 349/113 |
| 2004/0263425 | A1* | 12/2004 | Anzai | G06F 1/32 345/1.1 |
| 2006/0091399 | A1* | 5/2006 | Lee | H01L 27/12 257/72 |
| 2007/0109473 | A1* | 5/2007 | Higa | G02F 1/133555 349/114 |
| 2007/0159072 | A1* | 7/2007 | Oh | B82Y 10/00 313/504 |
| 2009/0079887 | A1* | 3/2009 | Yang | G02F 1/136213 349/38 |
| 2012/0001188 | A1* | 1/2012 | Hayashi | G02F 1/1339 257/59 |
| 2012/0307123 | A1* | 12/2012 | Cok | H01L 27/14603 348/333.01 |
| 2016/0043351 | A1* | 2/2016 | Hsu | H01L 51/002 438/99 |
| 2016/0247869 | A1* | 8/2016 | Li | G09G 3/3225 |

\* cited by examiner

Fig. 8 ained. A conventionalAMOLED backplane generally comprises
AMOLED BACKPLANE STRUCTURE AND MANUFACTURING METHOD THEREOF

BACKGROUND OF THE INVENTION

1. Field of the Invention

The present invention relates to the field of displaying technology, and in particular to an active matrix organic light emitting display (AMOLED) backplane structure and a manufacturing method thereof.

2. The Related Arts

An organic light emitting display (AMOLED) is a displaying technique having a extremely prosperous future. An OLED display device shows excellent displaying performance and also possesses various advantages, such as being self-luminous, simple structure, being ultra-thin and light, fast response speed, wide view angle, low power consumption, and being capable of achieving flexible displaying and is thus regarded as a "dream display" that attracts the attention of major display manufacturers and becomes the mainstream of the three-generation display devices of the field of display technology.

The OLED display devices are classified, according to the way of driving, into two categories, including passive matrix OLED (PMOLED) and active matrix OLED (AMOLED), namely direct addressing thin-film transistor (TFT) and matrix addressing. Among them, AMOLED is of an active displaying type, having a high light emission efficiency and being commonly used for manufacturing high definition large-sized display devices.

Figure 1:
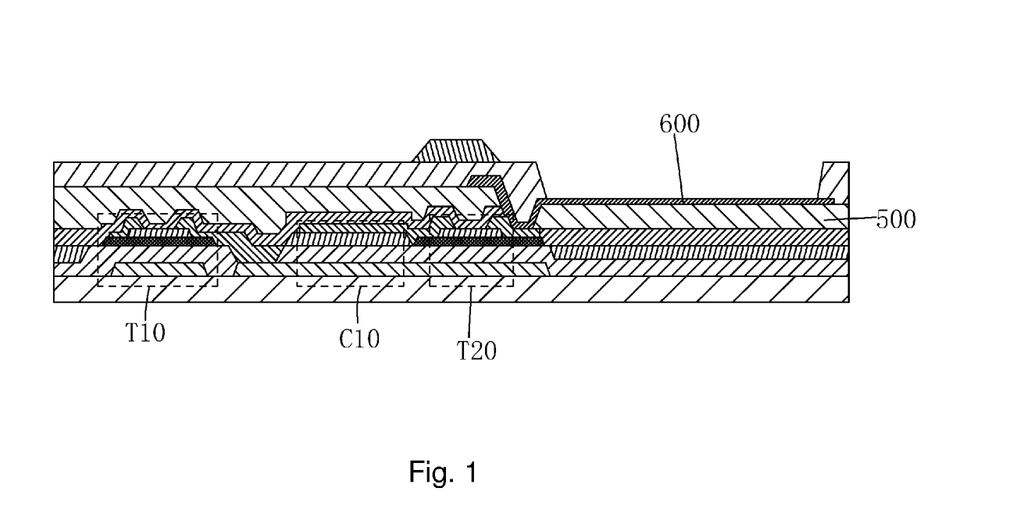
FIG. 1 is a cross-sectional view showing the structure of a conventional active matrix organic light emitting display (AMOLED) backplane.

A conventional AMOLED backplane generally comprises multiple pixels arranged in an array. Each of the pixels comprises three sub-pixels of red, green, and blue. As shown in FIG. 1, the conventional AMOLED backplane comprises a first thin-film transistor T10, a capacitor C10, and a second thin-film transistor T20 formed in an area thereof corresponding to each of sub-pixel. A pixel electrode 600 is formed on a planar surface of a planarization layer 500. In the area of a sub-pixel, due to the occupation of the first thin-film transistor T10, the capacitor C10, the second thin-film transistor T20 and related wiring of the sub-pixel area, only a smaller amount of area (namely the aperture ratio) is preserved for the pixel electrode 600 for effective displaying. In other words, the area of light emission is smaller. Consequently, to achieve a desired luminous brightness in a unit ear, an increased current density is necessary. This leads to accelerated aging of the OLED material. Further, comparison among the three sub-pixels of red, green, and blue, generally, the blue sub-pixel has a lower light emission efficiency and as a consequence, the blue sub-pixel must be provided with a larger area to ensure the illumination and lifespan of the blue sub-pixel. Relatively, the red and green sub-pixels have smaller areas. This leads to problems of design difficulty and reduction of resolution.

Figure 2:
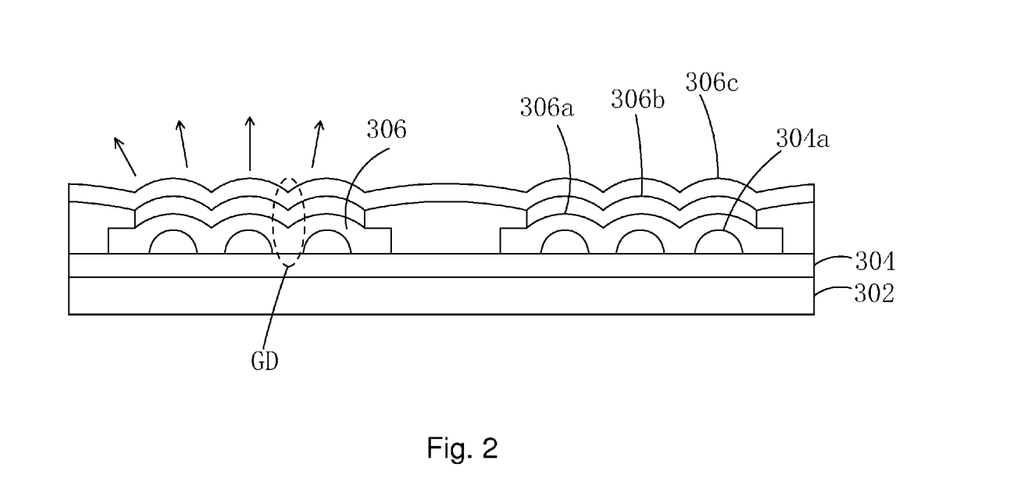
FIG. 2 is a schematic view illustrating a known OLED display device.

To increase an effective displaying area, Chinese Patent Application No. CN201410155846.2 discloses an OLED display device, As shown in FIG. 2, the disclosed OLED display device comprises a base plate 302. A planarization layer 304 is arranged on the base plate 302. Multiple curved sections 304a are arranged on the planarization layer 304 in a manner of being spaced from each other. The curved sections 304a comprise multiple corrugated surfaces. A cross-section of the curved sections 304a, in entirety thereof, has an arc contour. The planarization layer 304 comprises multiple light emission units 306 formed thereon and each of the light emission units 306 is set on each of the curved sections 304a and has a configuration corresponding to the curved section 304a. The light emission units 306 comprise a first electrode 306a, a light emissive structure 306b, and a second electrode 306c. With the arrangement of the planarization layer 304 that includes curved sections 304a, formation of light emission units 306 having curved surfaces can be achieved to help increase light emission areas of the light emission units 306 thereby improving luminous brightness. However, in the above-discussed patent document, the planarization layer 304 and the curved sections 304a are formed at the same time and there would be a potential risk that defects may occur in GD at abrupt change sites and thus affect the lifespan of the OLED. In addition, manufacturing of the curved sections 304a requires the use of gray scale masks; this increases the difficulty of the process and leads to deterioration of yield rate.

SUMMARY OF THE INVENTION

An object of the present invention is to provide an active matrix organic light emitting display (AMOLED) backplane structure, which helps ensure smoothness of a planarization layer without an abrupt change site and also makes a pixel electrode in the form of a curved configuration so as to increase an effective displaying area, extend a lifespan of an OLED, reduce the difficulty of manufacturing, and enhance resolution.

An object of the present invention is also to provide a manufacturing method of an AMOLED backplane, in which the method manufacture a planarization layer without use of a gray scale mask so as to reduce the difficulty of manufacturing and to ensure smoothness of the planarization layer without an abrupt change site and also make a pixel electrode in the form of a curved configuration so as to increase an effective displaying area, extend a lifespan of an OLED, enhance resolution, and improve yield rate of the manufacturing process.

To achieve the above objects, the present invention provides an AMOLED backplane, which comprises multiple sub-pixels arranged in an array, wherein in each of the sub-pixels, the AMOLED backplane comprises: a thin-film transistor (TFT) substrate, a planarization layer formed on the TFT substrate, a pixel electrode formed on the planarization layer, a pixel definition layer formed on the pixel electrode, and a photo spacer formed on the pixel definition layer;

the TFT substrate comprises therein a switch TFT, a drive TFT, and a capacitor;

the pixel definition layer comprises an opening to expose a portion of the pixel electrode;

the TFT substrate comprises a corrugation structure arranged in an area corresponding to the opening of the pixel definition layer, the corrugation structure comprising a plurality of raised sections and a recessed section formed between every two adjacent ones of the raised sections, the raised sections and the recessed sections having vertical dimensions identical to each other; and an upper surface of a portion of the planarization layer and a portion of the pixel electrode that correspond to and are located above the corrugation structure have curved configurations corresponding to the corrugation structure.

In each of the sub-pixels, the TFT substrate comprises a base plate, first and second gate terminals formed on the base plate and spaced from each other, a gate insulation layer formed on the first and second gate terminals and the base plate, first and second semiconductor layers formed on the gate insulation layer and respectively located on the first and second gate terminals, an etch stop layer formed on the first and second semiconductor layers and the gate insulation layer, a first source terminal formed on the etch stop layer and in contact engagement with the first semiconductor layer, a first drain terminal formed on the etch stop layer and in contact engagement with the first semiconductor layer and the second gate terminal, a second source terminal formed on the etch stop layer and in contact engagement with the second semiconductor layer, a second drain terminal formed on the etch stop layer and in contact engagement with the second semiconductor layer, and a protective layer formed on the etch stop layer, the first source and drain terminals, and the second source and drain terminals;

the first gate terminal, the first semiconductor layer, the first source terminal, and the first drain terminal constituting the switch TFT, the second gate terminal, the second semiconductor layer, the second source terminal, and the second drain terminal constituting the drive TFT, the second gate terminal and the second source terminal also constituting the capacitor, the pixel electrode being in contact engagement with the second drain terminal.

The corrugation structure is formed in the protective layer of the TFT substrate.

The corrugation structure is formed in the protective layer and the etch stop layer of the TFT substrate.

In each of the sub-pixels, the TFT substrate further comprises a metal layer formed between the protective layer and the etch stop layer in the area corresponding to the opening of the pixel definition layer and the metal layer is formed simultaneously with the first source and drain terminals and the second source and drain terminals;

the corrugation structure being formed on the metal layer.

The protective layer and the etch stop layer comprise a material of silicon nitride, silicon oxide, or a combination thereof; and the first and second gate terminals, the first source and drain terminals and the second source and drain terminals comprise a material of one of molybdenum, titanium, aluminum, and copper, or a combination thereof.

The pixel electrode comprises a material of indium tin oxide (ITO).

The corrugation structure is formed in a portion of or all the sub-pixels.

The present invention also provides an AMOLED backplane structure, which comprises multiple sub-pixels arranged in an array, wherein in each of the sub-pixels, the AMOLED backplane comprises: a TFT substrate, a planarization layer formed on the TFT substrate, a pixel electrode formed on the planarization layer, a pixel definition layer formed on the pixel electrode, and a photo spacer formed on the pixel definition layer;

the TFT substrate comprises therein a switch TFT, a drive TFT, and a capacitor;

the pixel definition layer comprises an opening to expose a portion of the pixel electrode;

the TFT substrate comprises a corrugation structure arranged in an area corresponding to the opening of the pixel definition layer, the corrugation structure comprising a plurality of raised sections and a recessed section formed between every two adjacent ones of the raised sections, the raised sections and the recessed sections having vertical dimensions identical to each other; and an upper surface of a portion of the planarization layer and a portion of the pixel electrode that correspond to and are located above the corrugation structure have curved configurations corresponding to the corrugation structure;

wherein in each of the sub-pixels, the TFT substrate comprises a base plate, first and second gate terminals formed on the base plate and spaced from each other, a gate insulation layer formed on the first and second gate terminals and the base plate, first and second semiconductor layers formed on the gate insulation layer and respectively located on the first and second gate terminals, an etch stop layer formed on the first and second semiconductor layers and the gate insulation layer, a first source terminal formed on the etch stop layer and in contact engagement with the first semiconductor layer, a first drain terminal formed on the etch stop layer and in contact engagement with the first semiconductor layer and the second gate terminal, a second source terminal formed on the etch stop layer and in contact engagement with the second semiconductor layer, a second drain terminal formed on the etch stop layer and in contact engagement with the second semiconductor layer, and a protective layer formed on the etch stop layer, the first source and drain terminals, and the second source and drain terminals;

the first gate terminal, the first semiconductor layer, the first source terminal, and the first drain terminal constituting the switch TFT, the second gate terminal, the second semiconductor layer, the second source terminal, and the second drain terminal constituting the drive TFT, the second gate terminal and the second source terminal also constituting the capacitor, the pixel electrode being in contact engagement with the second drain terminal;

wherein the corrugation structure is formed in a portion of or all the sub-pixels; and wherein the pixel electrode comprises a material of ITO.

The present invention further provides a manufacturing method of an AMOLED backplane, which comprises the following steps:

(1) manufacturing a TFT substrate and forming a corrugation structure during the manufacturing of the TFT substrate, wherein the corrugation structure comprises a plurality of raised sections and a recessed section between every two adjacent ones of the raised sections;

(2) coating organic photoresist on the TFT substrate that comprises the corrugation structure formed thereon to form a planarization layer in such a way that an upper surface of a portion of the planarization layer corresponding to and located above the corrugation structure comprises a curved configuration corresponding to the corrugation structure;

(3) forming a pixel electrode on the planarization layer in such a way that the pixel electrode shows a curved configuration; and (4) forming, in sequence, a pixel definition layer and a photo spacer on the pixel electrode and the planarization layer;

the pixel definition layer comprising an opening to expose the curved configuration of the pixel electrode.

The corrugation structure is formed through an etching process.

The efficacy of the present invention is that the present invention provides an AMOLED backplane structure, in which a TFT substrate comprises a corrugation structure in an area corresponding to an opening of a pixel definition layer and an upper surface of a portion of a planarization layer and a portion of a pixel electrode that correspond to the corrugation structure comprise curved configurations that correspond to the corrugation structure so as to ensure the planarization layer is smooth and free of abrupt change sites and also to increase an effective displaying area, extend a lifespan of the OLED, reduce difficulty of manufacturing, and improve resolution. The present invention provides a manufacturing method of an AMOLED backplane, in which in the same time of forming a TFT substrate, a corrugation structure is simultaneously formed and organic photoresist is directly coated to form a planarization layer so as to eliminate the need of a gray scale mask and reduce the difficulty of manufacturing, and then, a pixel electrode being formed on the planarization layer so as to ensure the planarization layer is smooth and free of abrupt change sites and also to make the pixel electrode a curved configuration to increase an effective displaying area, extend a lifespan of the OLED, improve resolution, and enhance yield rate of manufacturing.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as beneficial advantages, of the present invention will be apparent from the following detailed description of an embodiment of the present invention, with reference to the attached drawings. In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 3:
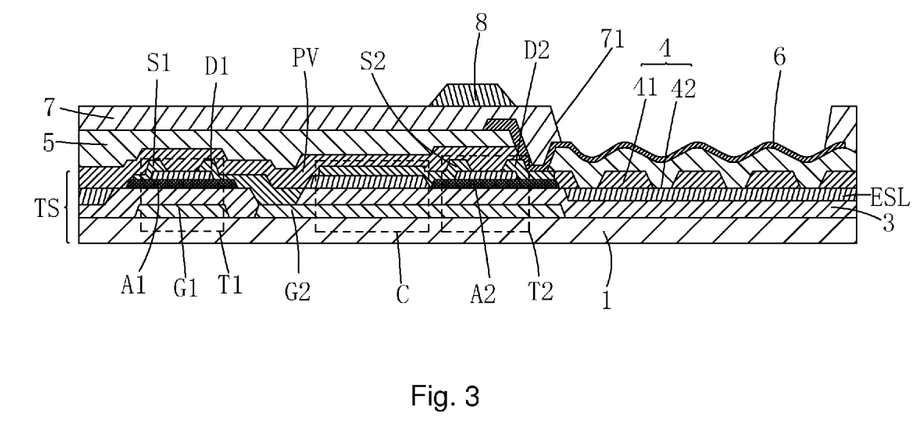
FIG. 3 is a cross-sectional view illustrating an AMOLED backplane structure according to a first embodiment of the present invention.

Firstly, the present invent provides an AMOLED backplane structure. Referring to FIG. 3, an AMOLED backplane structure according to a first embodiment of the present invention is shown, which comprises multiple sub-pixels arranged in an array. In each of the sub-pixels, the AMOLED backplane comprises: a thin-film transistor (TFT) substrate TS, a planarization layer 5 formed on the TFT substrate TS, a pixel electrode 6 formed on the planarization layer 5, a pixel definition layer 7 formed on the pixel electrode 6, and a photo spacer 8 formed on the pixel definition layer 7.

The TFT substrate TS comprises therein a switch TFT T1, a drive TFT T2, and a capacitor C.

The pixel definition layer 7 comprises an opening 71 formed therein to expose a portion of the pixel electrode 6.

The TFT substrate TS comprises a corrugation structure 4 arranged in an area corresponding to the opening 71 of the pixel definition layer 7. The corrugation structure 4 comprises a plurality of raised sections 41 and a recessed section 42 formed between every two adjacent ones of the raised sections 41. The raised sections 41 and the recessed sections 42 have vertical dimensions identical to each other. Further, the raised sections 41 have a cross-sectional shape of trapezoid and the recessed sections 42 have a cross-sectional shape of inverted trapezoid.

An upper surface of a portion of the planarization layer 5 and a portion of the pixel electrode 6 that correspond to and are located above the corrugation structure 4 have curved configurations corresponding to the corrugation structure 4.

In each of the sub-pixels, the TFT substrate TS comprises a base plate 1, first and second gate terminals G1, G2 formed on the base plate 1 and spaced from each other, a gate insulation layer 3 formed on the first and second gate terminals G1, G2 and the base plate 1, first and second semiconductor layers A1, A2 formed on the gate insulation layer 3 and respectively located on the first and second gate terminals G1, G2, an etch stop layer ESL formed on the first and second semiconductor layers A1, A2 and the gate insulation layer 3, a first source terminal S1 formed on the etch stop layer ESL and in contact engagement with the first semiconductor layer A1, a first drain terminal D1 formed on the etch stop layer ESL and in contact engagement with the first semiconductor layer A1 and the second gate terminal G2, a second source terminal S2 formed on the etch stop layer ESL and in contact engagement with the second semiconductor layer A2, a second drain terminal D2 formed on the etch stop layer ESL and in contact engagement with the second semiconductor layer A2, and a protective layer PV formed on the etch stop layer ESL, the first source and drain terminals S1, D1, and the second source and drain terminals S2, D2. The first gate terminal G1, the first semiconductor layer A1, the first source terminal S1, and the first drain terminal D1 constitute the switch TFT T1; and the second gate terminal G2, the second semiconductor layer A2, the second source terminal S2, and the second drain terminal D2 constitute the drive TFT T2. The second gate terminal G2 and the second source terminal S2 also constitute the capacitor C. The pixel electrode 6 is in contact engagement with the second drain terminal D2.

Specifically, the protective layer PV and the etch stop layer ESL comprise a material of silicon nitride, silicon oxide, or a combination thereof. The first and second gate terminals G1, G2, the first source and drain terminals S1, D1, and the second source and drain terminals S2, D2 comprise a material of one of molybdenum, titanium, aluminum, and copper, or a combination thereof. The pixel electrode 6 comprises a material of indium tin oxide (ITO).

It is noted here that the corrugation structure 4 can be of a single-layered structure formed in the TFT substrate TS or a multiple-layered structure formed in the TFT substrate TS, or can alternatively be a constituent layer formed of an insulation material in the TFT substrate TS or a constituent layer formed of a metallic material in the TFT substrate TS. As shown in FIG. 3, in the AMOLED backplane structure of the first embodiment of the present invention, the corrugation structure 4 is formed in the protective layer PV of the TFT substrate TS.

Figure 4:
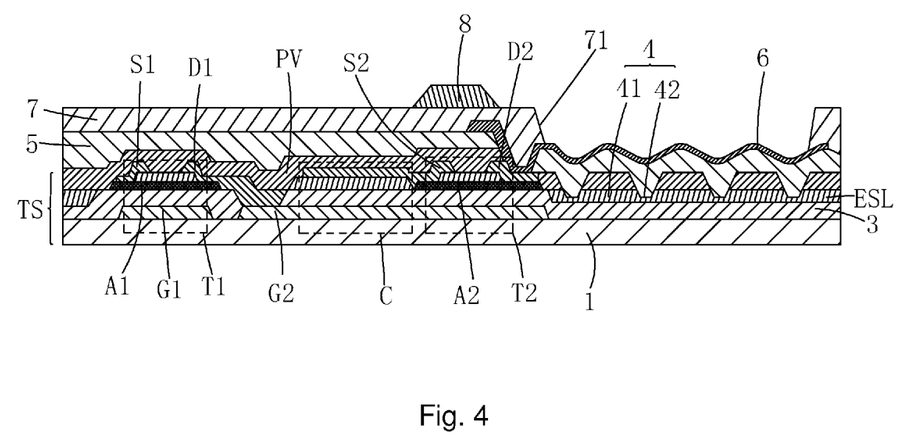
FIG. 4 is a cross-sectional view illustrating an AMOLED backplane structure according to a second embodiment of the present invention.

FIG. 4 illustrates an AMOLED backplane structure according to a second embodiment of the present invention, which is different from the first embodiment simply in that the corrugation structure 4 is formed in the protective layer PV and the etch stop layer ESL of the TFT substrate TS.

Figure 5:
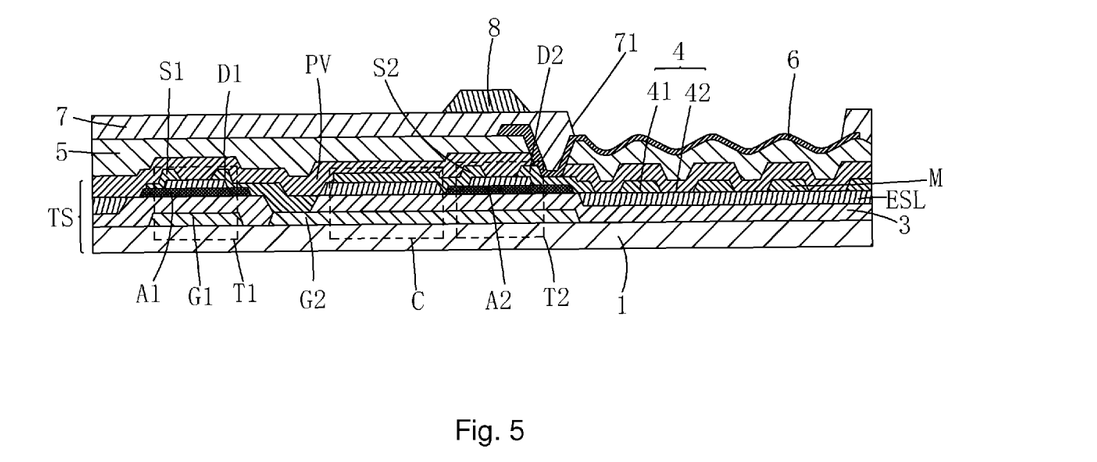
FIG. 5 is a cross-sectional view illustrating an AMOLED backplane structure according to a third embodiment of the present invention.

FIG. 5 illustrates an AMOLED backplane structure according to a third embodiment of the present invention, which is different from the first embodiment simply in that in each of the sub-pixels, the TFT substrate TS further comprises an interposed metal layer M formed between the protective layer PV and the etch stop layer ESL in the area corresponding to the opening 71 of the pixel definition layer 7. The metal layer M is formed simultaneously with the first source and drain terminals S1, D1 and the second source and drain terminals S2, D2. The corrugation structure 4 is formed on the metal layer M.

In the three embodiments described above, the portion of the planarization layer 5 that correspond to and is located above the corrugation structure 4 comprises a curved configuration corresponding to the corrugation structure 4 in order to ensure smoothness the planarization layer 5 and thus being free of abrupt change sites. Correspondingly, the portion of the pixel electrode 6 that is located on the planarization layer 5 also shows a curved configuration, which compared to a planar pixel electrode, increases an effective displaying area, extends a lifespan of the OLED, and reduces difficulty of manufacturing. It is noted here that the corrugation structure 4 can be only formed in some of the sub-pixels, such as being only formed in the blue sub-pixels in order to ensure the luminous brightness and lifespan of the blue sub-pixels and increase resolution without expansion of the area of the blue sub-pixels. It is apparent that the corrugation structure 4 may be formed in all the sub-pixels.

Referring to FIG. 5, in combination with FIG. 3, 4, or 5, the present invention also provides a manufacturing method of an AMOLED backplane for manufacturing the AMOLED backplane structures described with reference to the above three embodiments. The method comprises the following steps:

Step 1: manufacturing a TFT substrate TS and forming a corrugation structure 4 during the manufacturing of the TFT substrate TS, wherein the corrugation structure 4 comprises a plurality of raised sections 41 and a recessed section 42 between every two adjacent ones of the raised sections 41.

FIG. 5 illustrates, by taking the AMOLED backplane structure of the first embodiment shown in FIG. 3 as an example, in Step 1, in the same time of forming a protective layer PV, the protective layer PV is subjected to dry etching to form the corrugation structure 4.

For the AMOLED backplane structure of the second embodiment shown in FIG. 4, in Step 1, in the same time of forming a protective layer PV, the protective layer PV and an etch stop layer ESL are both subjected to dry etching to form the corrugation structure 4.

For the AMOLED backplane structure of the third embodiment shown in FIG. 5, in Step 1, in the same time of forming first source and drain terminals S1, D1 and second source and drain terminals S2, D2, a metal layer M is subjected to dry etching to form the corrugation structure 4.

Figure 6:
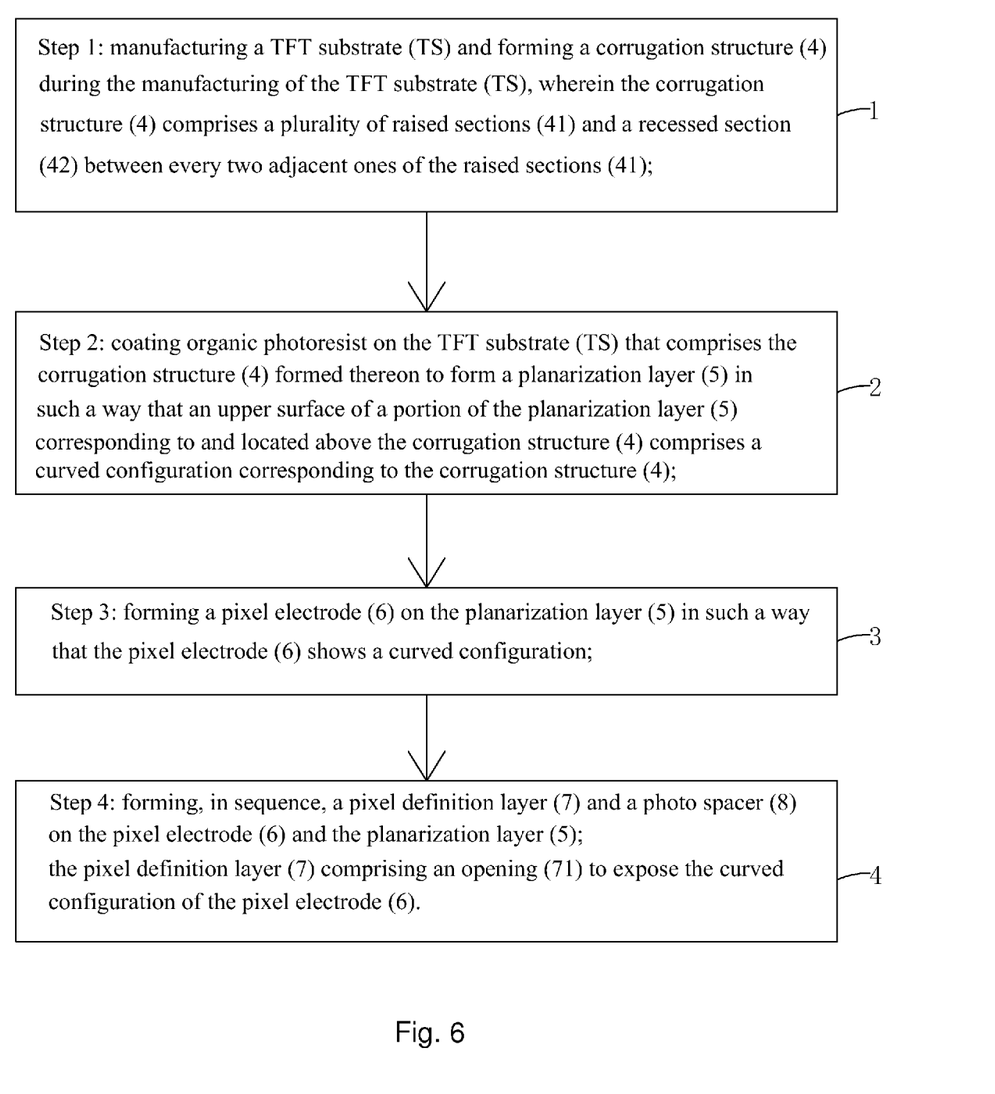
FIG. 6 is a flow chart illustrating a manufacturing method of an AMOLED backplane according to the present invention.
Figure 7:
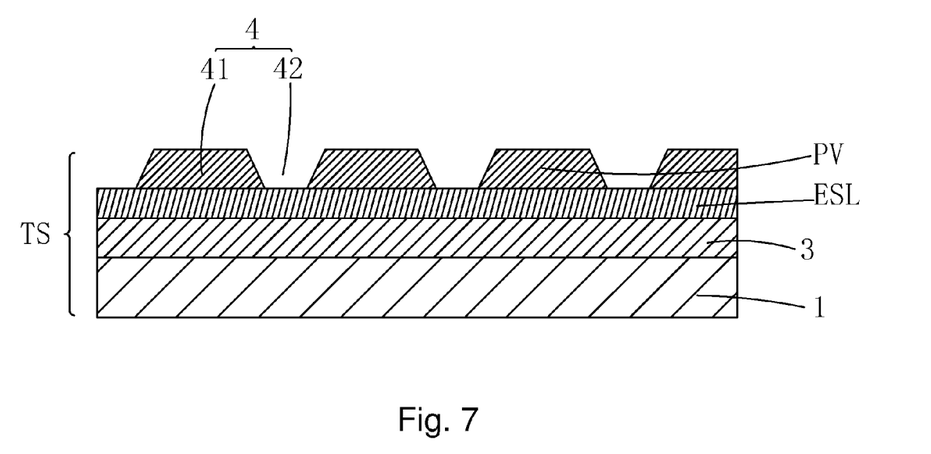
FIG. 7 is a schematic view illustrating a first step of the manufacturing method of the AMOLED backplane according to the present invention.
Figure 8:
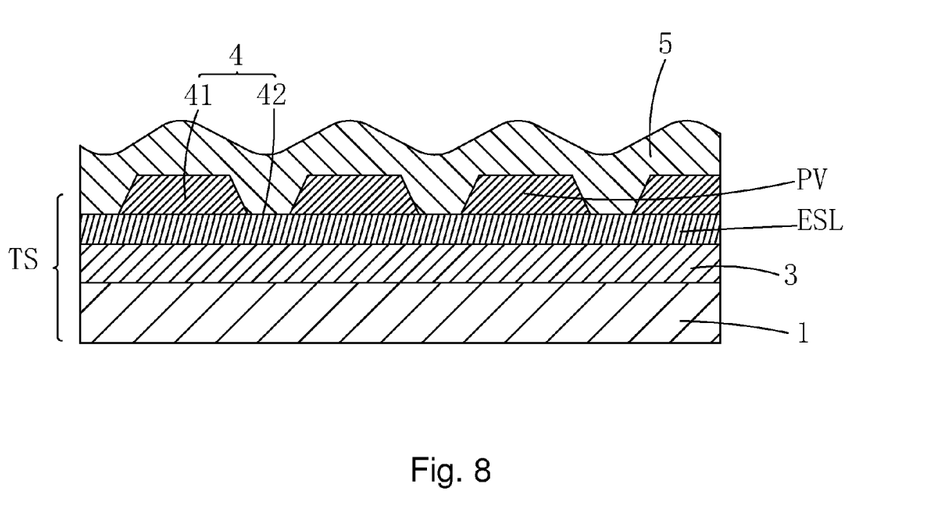
FIG. 8 is a schematic view illustrating a second step of the manufacturing method of the AMOLED backplane according to the present invention.

Step 2: as shown in FIG. 6, with the AMOLED backplane structure of the first embodiment shown in FIG. 3 being taken as an example, coating organic photoresist on the TFT substrate TS that comprises the corrugation structure 4 formed thereon to form a planarization layer 5 in such a way that an upper surface of a portion of the planarization layer 5 corresponding to and located above the corrugation structure 4 comprises a curved configuration corresponding to the corrugation structure 4 in order to ensure smoothness of the planarization layer and thus being free of abrupt change site.

In Step 2, the organic photoresist is directly coated to form the planarization layer 5 without a gray scale mask so that the difficulty of manufacturing is reduced.

Step 3: forming a pixel electrode 6 on the planarization layer 5 in such a way that the pixel electrode 6 shows a curved configuration.

Compared to a planar pixel electrode, the pixel electrode 6 that shows a curved configuration helps increase an effective displaying area.

Step 4: forming, in sequence, a pixel definition layer 7 and a photo spacer 8 on the pixel electrode 6 and the planarization layer 5.

The pixel definition layer 7 comprises an opening 71 to expose the curved configuration of the pixel electrode 6.

In summary, the present invention provides an AMOLED backplane structure, in which a TFT substrate comprises a corrugation structure in an area corresponding to an opening of a pixel definition layer and an upper surface of a portion of a planarization layer and a portion of a pixel electrode that correspond to the corrugation structure comprise curved configurations that correspond to the corrugation structure so as to ensure the planarization layer is smooth and free of abrupt change sites and also to increase an effective displaying area, extend a lifespan of the OLED, reduce difficulty of manufacturing, and improve resolution. The present invention provides a manufacturing method of an AMOLED backplane, in which in the same time of forming a TFT substrate, a corrugation structure is simultaneously formed and organic photoresist is directly coated to form a planarization layer so as to eliminate the need of a gray scale mask and reduce the difficulty of manufacturing, and then, a pixel electrode being formed on the planarization layer so as to ensure the planarization layer is smooth and free of abrupt change sites and also to make the pixel electrode a curved configuration to increase an effective displaying area, extend a lifespan of the OLED, improve resolution, and enhance yield rate of manufacturing.

Based on the description given above, those having ordinary skills of the art may easily contemplate various changes and modifications of the technical solution and technical ideas of the present invention and all these changes and modifications are considered within the protection scope of right for the present invention.

What is claimed is:

1. An active matrix organic light emitting display (AMOLED) backplane structure, comprising multiple sub-pixels arranged in an array, wherein in each of the sub-pixels, the AMOLED backplane comprises: a thin-film transistor (TFT) substrate, a planarization layer formed on the TFT substrate, a pixel electrode formed on the planarization layer, a pixel definition layer formed on the pixel electrode, and a photo spacer formed on the pixel definition layer;

the TFT substrate comprises therein a switch TFT, a drive TFT, and a capacitor;

the pixel definition layer comprises an opening to expose a portion of the pixel electrode the TFT substrate comprises a corrugation structure arranged in an area corresponding to the opening of the pixel definition layer, the corrugation structure comprising a plurality of raised sections and a recessed section formed between every two adjacent ones of the raised sections, the raised sections and the recessed sections having vertical dimensions identical to each other; and an upper surface of a portion of the planarization layer and a portion of the pixel electrode that correspond to and are located above the corrugation structure have curved configurations corresponding to the corrugation structure.

2. The AMOLED backplane structure as claimed in claim 1, wherein in each of the sub-pixels, the TFT substrate comprises a base plate, first and second gate terminals formed on the base plate and spaced from each other, a gate insulation layer formed on the first and second gate terminals and the base plate, first and second semiconductor layers formed on the gate insulation layer and respectively located on the first and second gate terminals, an etch stop layer formed on the first and second semiconductor layers and the gate insulation layer, a first source terminal formed on the etch stop layer and in contact engagement with the first semiconductor layer, a first drain terminal formed on the etch stop layer and in contact engagement with the first semiconductor layer and the second gate terminal, a second source terminal formed on the etch stop layer and in contact engagement with the second semiconductor layer, a second drain terminal formed on the etch stop layer and in contact engagement with the second semiconductor layer, and a protective layer formed on the etch stop layer, the first source and drain terminals, and the second source and drain terminals;

the first gate terminal, the first semiconductor layer, the first source terminal, and the first drain terminal constituting the switch TFT, the second gate terminal, the second semiconductor layer, the second source terminal, and the second drain terminal constituting the drive TFT, the second gate terminal and the second source terminal also constituting the capacitor, the pixel electrode being in contact engagement with the second drain terminal.

3. The AMOLED backplane structure as claimed in claim 2, wherein the corrugation structure is formed in the protective layer of the TFT substrate.

4. The AMOLED backplane structure as claimed in claim 2, wherein the corrugation structure is formed in the protective layer and the etch stop layer of the TFT substrate.

5. The AMOLED backplane structure as claimed in claim 2, wherein in each of the sub-pixels, the TFT substrate further comprises a metal layer formed between the protective layer and the etch stop layer in the area corresponding to the opening of the pixel definition layer and the metal layer is formed simultaneously with the first source and drain terminals and the second source and drain terminals;

the corrugation structure being formed on the metal layer.

6. The AMOLED backplane structure as claimed in claim 2, wherein the protective layer and the etch stop layer comprise a material of silicon nitride, silicon oxide, or a combination thereof; and the first and second gate terminals, the first source and drain terminals and the second source and drain terminals comprise a material of one of molybdenum, titanium, aluminum, and copper, or a combination thereof.

7. The AMOLED backplane structure as claimed in claim 2, wherein the pixel electrode comprises a material of indium tin oxide (ITO).

8. The AMOLED backplane structure as claimed in claim 1, wherein the corrugation structure is formed in a portion of or all the sub-pixels.

9. An active matrix organic light emitting display (AMOLED) backplane structure, comprising multiple sub-pixels arranged in an array, wherein in each of the sub-pixels, the AMOLED backplane comprises: a thin-film transistor (TFT) substrate, a planarization layer formed on the TFT substrate, a pixel electrode formed on the planarization layer, a pixel definition layer formed on the pixel electrode, and a photo spacer formed on the pixel definition layer;

the TFT substrate comprises therein a switch TFT, a drive TFT, and a capacitor;

the pixel definition layer comprises an opening to expose a portion of the pixel electrode;

the TFT substrate comprises a corrugation structure arranged in an area corresponding to the opening of the pixel definition layer, the corrugation structure comprising a plurality of raised sections and a recessed section formed between every two adjacent ones of the raised sections, the raised sections and the recessed sections having vertical dimensions identical to each other; and an upper surface of a portion of the planarization layer and a portion of the pixel electrode that correspond to and are located above the corrugation structure have curved configurations corresponding to the corrugation structure;

wherein in each of the sub-pixels, the TFT substrate comprises a base plate, first and second gate terminals formed on the base plate and spaced from each other, a gate insulation layer formed on the first and second gate terminals and the base plate, first and second semiconductor layers formed on the gate insulation layer and respectively located on the first and second gate terminals, an etch stop layer formed on the first and second semiconductor layers and the gate insulation layer, a first source terminal formed on the etch stop layer and in contact engagement with the first semiconductor layer, a first drain terminal formed on the etch stop layer and in contact engagement with the first semiconductor layer and the second gate terminal, a second source terminal formed on the etch stop layer and in contact engagement with the second semiconductor layer, a second drain terminal formed on the etch stop layer and in contact engagement with the second semiconductor layer, and a protective layer formed on the etch stop layer, the first source and drain terminals, and the second source and drain terminals;

the first gate terminal, the first semiconductor layer, the first source terminal, and the first drain terminal constituting the switch TFT, the second gate terminal, the second semiconductor layer, the second source terminal, and the second drain terminal constituting the drive TFT, the second gate terminal and the second source terminal also constituting the capacitor, the pixel electrode being in contact engagement with the second drain terminal;

wherein the corrugation structure is formed in a portion of or all the sub-pixels; and wherein the pixel electrode comprises a material of indium tin oxide (ITO).

10. The AMOLED backplane structure as claimed in claim 9, wherein the corrugation structure is formed in the protective layer of the TFT substrate.

11. The AMOLED backplane structure as claimed in claim 9, wherein the corrugation structure is formed in the protective layer and the etch stop layer of the TFT substrate.

12. The AMOLED backplane structure as claimed in claim 9, wherein in each of the sub-pixels, the TFT substrate further comprises a metal layer formed between the protective layer and the etch stop layer in the area corresponding to the opening of the pixel definition layer and the metal layer is formed simultaneously with the first source and drain terminals and the second source and drain terminals;

the corrugation structure being formed on the metal layer.

13. The AMOLED backplane structure as claimed in claim 9, wherein the protective layer and the etch stop layer comprise a material of silicon nitride, silicon oxide, or a combination thereof; and the first and second gate terminals, the first source and drain terminals and the second source and drain terminals comprise a material of one of molybdenum, titanium, aluminum, and copper, or a combination thereof.

* * * * *